United States Patent
Kim et al.

(10) Patent No.: US 9,123,675 B2
(45) Date of Patent: Sep. 1, 2015

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Kang-Hyun Kim, Gyeongju-si (KR); Ki-Soub Yang, Paju-si (KR); Dae-Jung Choi, Paju-si (KR); Seung-Ryul Choi, Goyang-si (KR); Han-Hee Kim, Anseong-si (KR); Kyoung-Jin Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 4 days.

(21) Appl. No.: 14/098,098

(22) Filed: Dec. 5, 2013

(65) Prior Publication Data

US 2015/0001486 A1 Jan. 1, 2015

(30) Foreign Application Priority Data

Jun. 28, 2013 (KR) ........................ 10-2013-0075522

(51) Int. Cl.
*H01L 35/24* (2006.01)
*H01L 51/00* (2006.01)
*H01L 27/32* (2006.01)
*H01L 51/52* (2006.01)

(52) U.S. Cl.
CPC .......... *H01L 27/3246* (2013.01); *H01L 51/5284* (2013.01)

(58) Field of Classification Search
CPC ..... H01L 35/24; H01L 51/00; H01L 51/0545; H01L 51/0036; H01L 51/0541; H01L 51/5012
USPC .................... 257/40, 79; 438/29, 34
See application file for complete search history.

(56) References Cited

U.S. PATENT DOCUMENTS

| | | | |
|---|---|---|---|
| 2003/0127657 A1* | 7/2003 | Park ................................ | 257/79 |
| 2009/0072226 A1* | 3/2009 | Koo et al. ........................ | 257/40 |
| 2010/0231490 A1* | 9/2010 | Okano ............................ | 345/80 |
| 2011/0284838 A1* | 11/2011 | Saito .............................. | 257/43 |
| 2013/0038203 A1* | 2/2013 | Kim .............................. | 313/504 |
| 2013/0203197 A1* | 8/2013 | Tsai et al. ....................... | 438/35 |
| 2013/0221337 A1* | 8/2013 | Sakuma et al. ................. | 257/40 |
| 2014/0145158 A1* | 5/2014 | Choi et al. ...................... | 257/40 |
| 2014/0159067 A1* | 6/2014 | Sakariya et al. ................ | 257/88 |

* cited by examiner

*Primary Examiner* — Phuc Dang
(74) *Attorney, Agent, or Firm* — Dentons U.S. LLP

(57) ABSTRACT

An organic light emitting diode display device includes a first substrate including a display region, wherein a plurality of pixel regions are defined in the display region; a first electrode over the first substrate and in each of the plurality of pixel regions; a first bank on edges of the first electrode and including an insulating material blocking penetration of light; a second bank on the first bank and including an insulating material having a hydrophobic property; an organic light emitting layer on the first electrode and a portion of the first bank; and a second electrode on the organic light emitting layer and covering an entire surface of the display region.

14 Claims, 15 Drawing Sheets

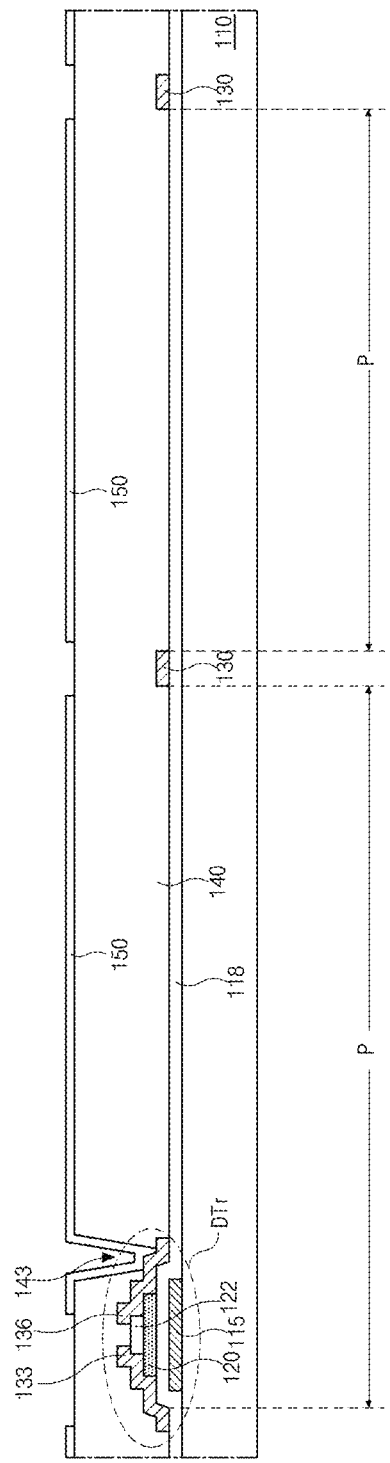

ORGANIC LIGHT EMITTING DIODE DISPLAY DEVICE AND METHOD OF FABRICATING THE SAME

CROSS REFERENCE TO RELATED APPLICATIONS

The present application claims the benefit of Korean Patent Application No. 10-2013-0075522 filed in Korea on Jun. 28, 2013, which is hereby incorporated by reference for all purposes as if fully set forth herein.

BACKGROUND OF THE INVENTION

1. Field of the Invention

The invention relates to an organic light emitting diode (OLED) display device, which may be referred to as an organic electroluminescent display device. More particularly, the invention to an OLED display device having a bank of a double-layered structure and a method of fabricating the same.

2. Discussion of the Related Art

An OLED display device of flat panel display devices has high brightness and low driving voltage. The OLED display device is a self-emitting type and has excellent characteristics of view angle, contrast ratio, response time, etc.

Accordingly, the OLED display device is widely used for a television, a monitor, a mobile phone, and so on.

The OLED display device includes an array element and an organic light emitting diode. The array element includes a switching thin film transistor (TFT), which is connected to a gate line and a data line, a driving TFT, which is connected to the switching TFT, and a power line, which is connected to the driving TFT. The organic light emitting diode includes a first electrode, which is connected to the driving TFT, and further includes an organic light emitting layer and a second electrode.

In the OLED display device, light from the organic light emitting layer passes through the first electrode or the second electrode to display an image. A top emission type OLED display device, where the light passes through the second electrode, has an advantage in an aperture ratio.

Generally, the organic light emitting layer is formed by a thermal deposition method using a shadow mask. However, the shadow mask sags because the shadow mask becomes larger with an increase in sizes of display devices. As a result, there is a problem in deposition uniformity in the larger display device. In addition, since a shadow effect is generated in the thermal deposition method using the shadow mask, it is very difficult to fabricate a high resolution OLED display device, e.g., above 250 PPI (pixels per inch).

Accordingly, a method different from the thermal deposition method using the shadow mask has been introduced.

In the method, a liquid phase organic light emitting material is sprayed or dropped in a region surrounded by a wall using an liquid-releasing apparatus or a nozzle-coating apparatus and cured to form the organic light emitting layer.

FIGS. 1A to 1C are schematic cross-sectional views showing an OLED display device according to the related art in steps of fabricating the OLED display device and steps of forming a bank and forming an organic light emitting layer by spraying or dropping a liquid phase organic light emitting material.

To spray or drop the liquid phase organic light emitting material by the liquid-releasing apparatus or the nozzle-coating apparatus, the bank, which is formed on a first electrode and surrounds a pixel region, is required to prevent the liquid phase organic light emitting material from flooding into a next pixel region. Accordingly, the bank is formed on edges of the first electrode before forming the organic light emitting layer.

At this time, the bank is formed of a material having a hydrophobic property. The hydrophobic bank prevents the liquid phase organic light emitting material, which has a hydrophilic property, from being formed on the bank and flooding into the next pixel region due to a mis-alignment of the liquid-releasing apparatus or the nozzle-coating apparatus or an excessive amount of the organic light emitting material.

As shown in FIG. 1A, the bank may be formed by a mask process, which includes a light-exposing step using an exposing mask 91 and a developing step after an organic insulating material having a hydrophobic property is applied to an entire surface of a substrate 10 on which a first electrode 50 is formed at each pixel region P.

Here, the light-exposing step using the exposing mask 91 may include irradiating high lux UV light of several hundred mW/cm$^2$.

With an increase in a size of a display device, a substrate for the display device has been larger, and a scan-type exposure has been performed onto the large-sized substrate because it is not possible to expose a whole of the large-sized substrate to light at a time.

The scan-type exposure decreases the productivity per unit time as compared to a process of exposing the substrate to light at a time. To prevent the productivity from being decreased, in the scan-type exposure, high lux UV light of several hundred mW/cm$^2$ instead of typical UV light of several dozen mW/cm$^2$, which is generally used in a light-exposing step, has been used.

When the light-exposing step with the high lux UV light is performed, a scan speed is several times to several dozen times as fast as the typical UV light. Therefore, a process time of the light-exposing step per unit time decreases, and the productivity per unit time increases.

However, when the high lux UV light of several hundred mW/cm$^2$ is irradiated to an organic insulating material layer 52 by a scan-type exposure apparatus 80 using the high lux UV light, light from the scan-type exposure apparatus 80 may be reflected by signal lines 30 or electrodes (not shown) of a metallic material or by a stage 93 of the exposure apparatus 80 and may reach a central portion of the pixel region P even if an amount of the light is a little. Here, the organic insulating material layer 52 has a hydrophobic property.

Accordingly, as shown in FIG. 1B, after developing the organic insulating material layer 52 of FIG. 1A exposed to light, the bank 53 is formed along boundaries of the pixel region P, and organic insulating material residues 54 with the hydrophobic property remain on the first electrode 50 at the central portion of the pixel region P. The organic insulating material residues 54 may be referred to as organic insulating material residual layers.

Meanwhile, the bank 53 has a width w1' larger than a designated width w1 because a tail is lengthened due to the reflected light during the light-exposing step.

Next, as shown in FIG. 1C, by spraying or dropping a liquid phase organic light emitting material from an liquid-releasing apparatus 95 into the pixel region P, which is surrounded by the bank 53, the pixel region P is filled with the organic light emitting material. The organic light emitting material is dried and cured by heat to form an organic light emitting layer 55.

However, since the residues 54 have the hydrophobic property, the residues 54 hinder the liquid phase organic light emitting material from being spread in the pixel region P when the liquid phase organic light emitting material is sprayed or dropped. Accordingly, as shown in FIG. 1C and FIG. 2, which is a picture of showing one pixel region in the related art OLED display device, the organic light emitting layer 55 is not formed around the hydrophobic bank 53, or a portion of the organic light emitting layer around the hydrophobic bank 53 has a thinner thickness than portions in other regions. Thus, dark images are displayed in edges of the pixel region P. In addition, the OLED display device is degraded fast due to the difference in thicknesses, and the lifetime of the OLED display device is shortened.

Moreover, as stated above, since the bank 53 has the width w1' larger than the designed width w1, an area for the organic light emitting layer 55 is reduced, and the aperture ratio is lowered.

SUMMARY OF THE INVENTION

Accordingly, the present invention is directed to an OLED display device that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, an organic light emitting diode display device includes a first substrate including a display region, wherein a plurality of pixel regions are defined in the display region; a first electrode over the first substrate and in each of the plurality of pixel regions; a first bank on edges of the first electrode and including an insulating material blocking penetration of light; a second bank on the first bank and including an insulating material having a hydrophobic property; an organic light emitting layer on the first electrode and a portion of the first bank; and a second electrode on the organic light emitting layer and covering an entire surface of the display region.

In another aspect, a method of fabricating an organic light emitting diode display device includes forming a first electrode over a first substrate including a display region, which includes a plurality of pixel regions, the first electrode formed in each of the plurality of pixel regions; forming a first bank on edges of the first electrode and the first bank including an insulating material blocking penetration of light and having a first width; forming a second bank on the first bank and the second bank including an insulating material having a hydrophobic property and having a second width smaller than the first width; forming an organic light emitting layer on the first electrode and a portion of the first bank surrounded by the second bank in each of the plurality of pixel regions; and forming a second electrode on the organic light emitting layer, the second electrode covering an entire surface of the display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 8A to 8H are cross-sectional views showing a fabricating process of an OLED display device according to an embodiment of the present invention.

DETAILED DESCRIPTION OF THE ILLUSTRATED EMBODIMENTS

Reference will now be made in detail to the preferred embodiments, examples of which are illustrated in the accompanying drawings.

Figure 3:
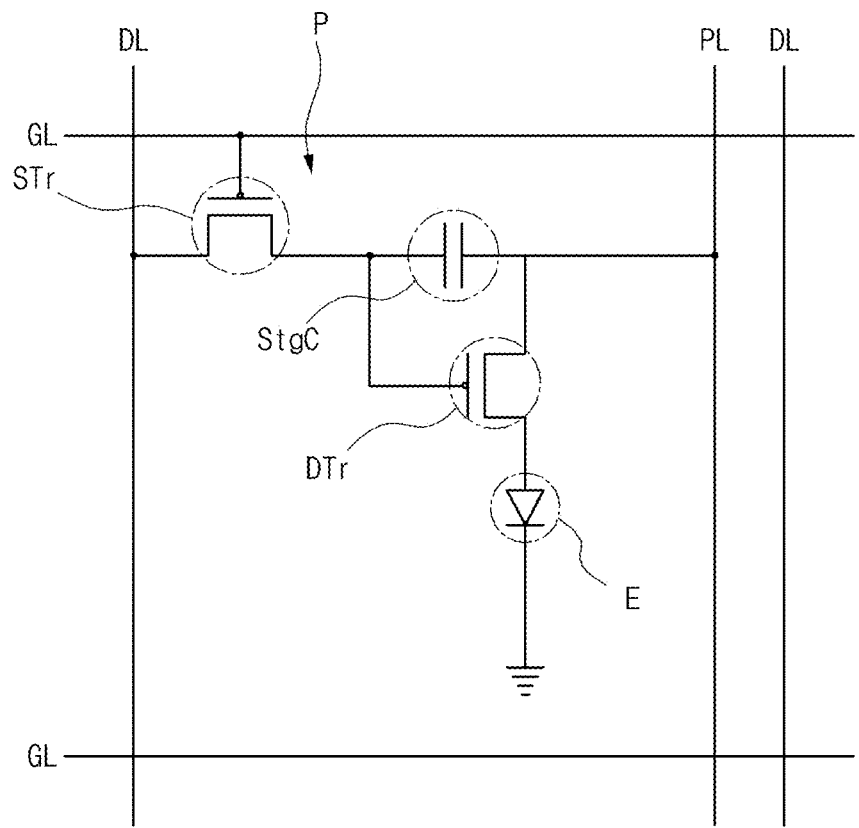
FIG. 3 is a circuit diagram of one pixel region of an OLED display device.

FIG. 3 is a circuit diagram of one pixel region of an OLED device.

As shown in FIG. 3, an OLED display device includes a switching thin film transistor (TFT) STr, a driving TFT DTr, a storage capacitor StgC and an light emitting diode E in each pixel region P.

On a substrate (not shown), a gate line GL along a first direction and a data line DL along a second direction are formed. The gate line GL and the data line DL cross each other to define the pixel region P. A power line PL for providing a source voltage to the emitting diode E is formed to be parallel to and spaced apart from the data line DL.

The switching TFT STr is connected to the gate and data lines GL and DL, and the driving TFT DTr and the storage capacitor StgC are connected to the switching TFT STr and the power line PL. The light emitting diode E is connected to the driving TFT DTr.

A first electrode of the light emitting diode E is connected to a drain electrode of the driving TFT DTr, and a second electrode of the light emitting diode E is grounded.

When the switching TFT STr is turned on by a gate signal applied through the gate line GL, a data signal from the data line DL is applied to the gate electrode of the driving TFT DTr and an electrode of the storage capacitor StgC. When the driving TFT DTr is turned on by the data signal, an electric current is supplied to the light emitting diode E from the power line PL. As a result, the light emitting diode E emits light. In this case, when the driving TFT DTr is turned on, a level of an electric current applied from the power line PL to the light emitting diode E is determined such that the light emitting diode E can produce a gray scale. The storage capacitor StgC serves to maintain the voltage of the gate electrode of the driving TFT DTr when the switching TFT STr is turned off. Accordingly, even if the switching TFT STr is turned off, a level of an electric current applied from the power line PL to the light emitting diode E is maintained until a next frame.

Figure 4:
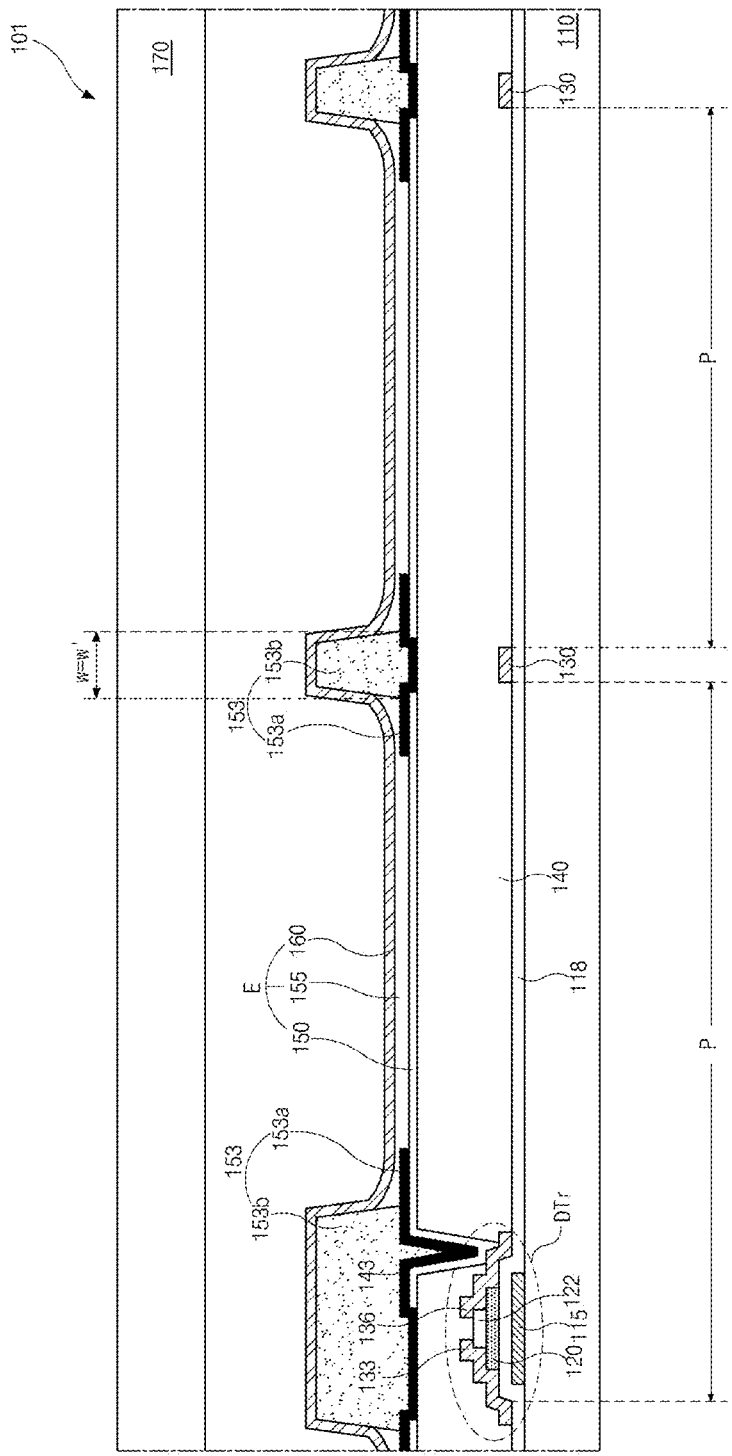
FIG. 4 is a schematic cross-sectional view of an OLED display device according to an embodiment of the present invention.

FIG. 4 is a schematic cross-sectional view of an OLED display device according to an embodiment of the present invention. For convenience of explanation, a driving area where a driving TFT DTr is formed, a pixel region P where an light emitting diode E is formed, and a switching area (not shown) where a switching TFT (not shown) is formed are defined.

As shown in FIG. 4, an OLED display device 101 of the present invention includes a first substrate 110, where the driving TFT DTr, the switching TFT (not shown) and the light emitting diode E are formed, and a second substrate 170 for encapsulation. The second substrate 170 may be an inorganic insulating film or an organic insulating film.

A gate line (not shown) and a data line 130 are formed on the first substrate 110. The gate line and the data line 130 cross each other to define the pixel region P. A power line (not shown) for providing a voltage to the light emitting diode E is formed to be parallel to and spaced apart from the data line 130.

In each pixel region P, the switching TFT is connected to the gate line and the data line 130, and the driving TFT DTr and a storage capacitor are connected to the switching TFT and the power line.

The driving TFT DTr includes a gate electrode 115, a gate insulating layer 118, an oxide semiconductor layer 120, an etch-stopper 122, a source electrode 133 and a drain electrode 136. The gate insulating layer 118 covers the gate electrode 115, and the oxide semiconductor layer 120 is disposed on the gate insulating layer 118. The oxide semiconductor layer 120 corresponds to the gate electrode 115. The etch-stopper 122 covers a center of the oxide semiconductor layer 120. The source electrode 133 and the drain electrode 136 are formed on the etch-stopper 122 and spaced apart from each other. The source electrode 133 and the drain electrode 136 contact both ends of the oxide semiconductor layer 120, respectively. Although not shown, the switching TFT has substantially the same structure as the driving TFT DTr.

Figure 5:
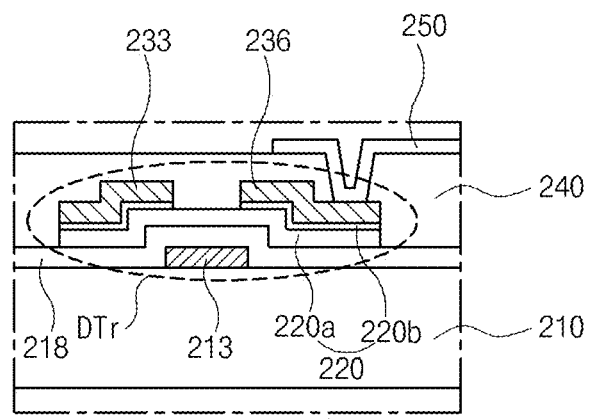
FIG. 5 is a schematic cross-sectional view of an OLED display device according to another embodiment of the present invention.

In FIG. 4, each of the driving TFT DTr and the switching TFT includes the oxide semiconductor layer 120 of an oxide semiconductor material. Alternatively, as shown in FIG. 5, each of the driving TFT DTr and the switching TFT may include a gate electrode 213, a gate insulating layer 218, a semiconductor layer 220 including an active layer 220a of intrinsic amorphous silicon and an ohmic contact layer 220b of impurity-doped amorphous silicon, a source electrode 233 and a drain electrode 236. In FIGS. 4 and 5, the driving TFT DTr has a bottom gate structure where the gate electrode 115 or 213 is positioned at a lowest layer.

Figure 6:
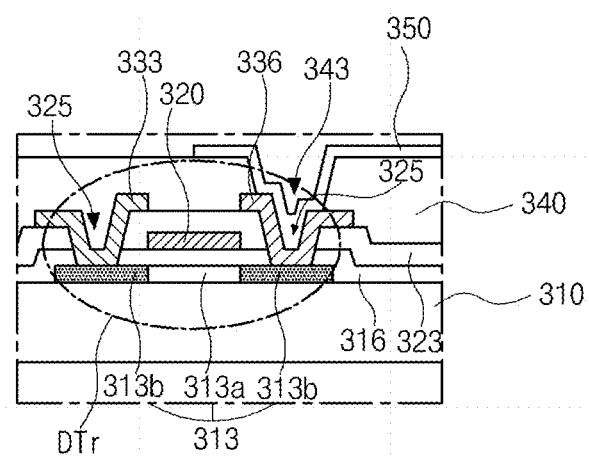
FIG. 6 is a schematic cross-sectional view of an OLED display device according to another embodiment of the present invention.

Meanwhile, in an alternate embodiment each of the driving TFT DTr and the switching TFT may have a top gate structure where the semiconductor layer is positioned at a lowest layer. Specifically, as shown in FIG. 6, each of the driving TFT DTr and the switching TFT may include a semiconductor layer 313, which includes an active region 313a of intrinsic polysilicon and impurity-doped regions 313b at both sides of the active region 313a, on a first substrate 310, a gate insulating layer 316, a gate electrode 320 corresponding to the active region 313a of the semiconductor layer 313, an interlayer insulating layer 323 having semiconductor contact holes 325, which expose the impurity-doped regions 313b of the semiconductor layer 313, and source and drain electrodes 333 and 336 respectively connected to the impurity-doped regions 313b through the semiconductor contact holes 325.

The top gate structure TFT requires the interlayer insulating layer 323 in comparison to the bottom gate structure TFT. In the top gate structure TFT, the gate line (not shown) is formed on the gate insulating layer 316, and the data line (not shown) is formed on the interlayer insulating layer 323.

Referring again to FIG. 4, a passivation layer 140, which includes a drain contact hole 143 exposing the drain electrode 136 of the driving TFT DTr, is formed over the driving TFT DTr and the switching TFT. For example, the passivation layer 140 may be formed of an organic insulating material, e.g., photo-acryl, to have a flat top surface.

A first electrode 150, which contacts the drain electrode 136 of the driving TFT DTr through the drain contact hole 143, is formed on the passivation layer 140 and separately in each pixel region P.

The first electrode 150 is formed of a conductive material having a relatively high work function, e.g., about 4.8 eV to 5.2 eV. For example, the first electrode 150 may be formed of a transparent conductive material such as indium-tin-oxide (ITO) to serve as an anode.

A bank 153 having a double-layered structure, which includes a first bank 153a and a second bank 153b, is formed on the first electrode 150 along boundaries of the pixel region P. The bank 153 overlaps edges of the first electrode 150 such that a center of the first electrode 150 is exposed by the bank 153.

The first bank 153a, as a lower layer, may be formed of an insulating material having relatively high light absorptivity and blocking penetration of light such as chromium oxide (CrOx), for example. The first bank 153a has a first width. The second bank 153b is disposed on the first bank 153a and has a second width w' smaller than the first width. The second bank 153b may be formed of an organic material having a hydrophobic property. The organic material may include at least one of polyimide containing fluorine (F), styrene, methylmethacrylate, and polytetrafluoroethylene.

In the OLED display device 101 including the bank 153 of a double-layered structure, which includes the first bank 153a blocking penetration of light and having the first width and the second bank 153b having the hydrophobic property and the second width w', hydrophobic residues hardly remain on the first electrode 150 after forming the bank 153 because light is not reflected by signal lines of a metallic material such as the gate line, the data line 130, and the power line under the first bank 153a or a stage of an exposure apparatus when the second bank 153b is formed by performing an exposing step using a scan-type exposure apparatus with high lux UV light.

Accordingly, a liquid phase organic light emitting material can be spread well in the pixel region P surrounded by the bank 153 when the material is sprayed or dropped.

Figure 1A:
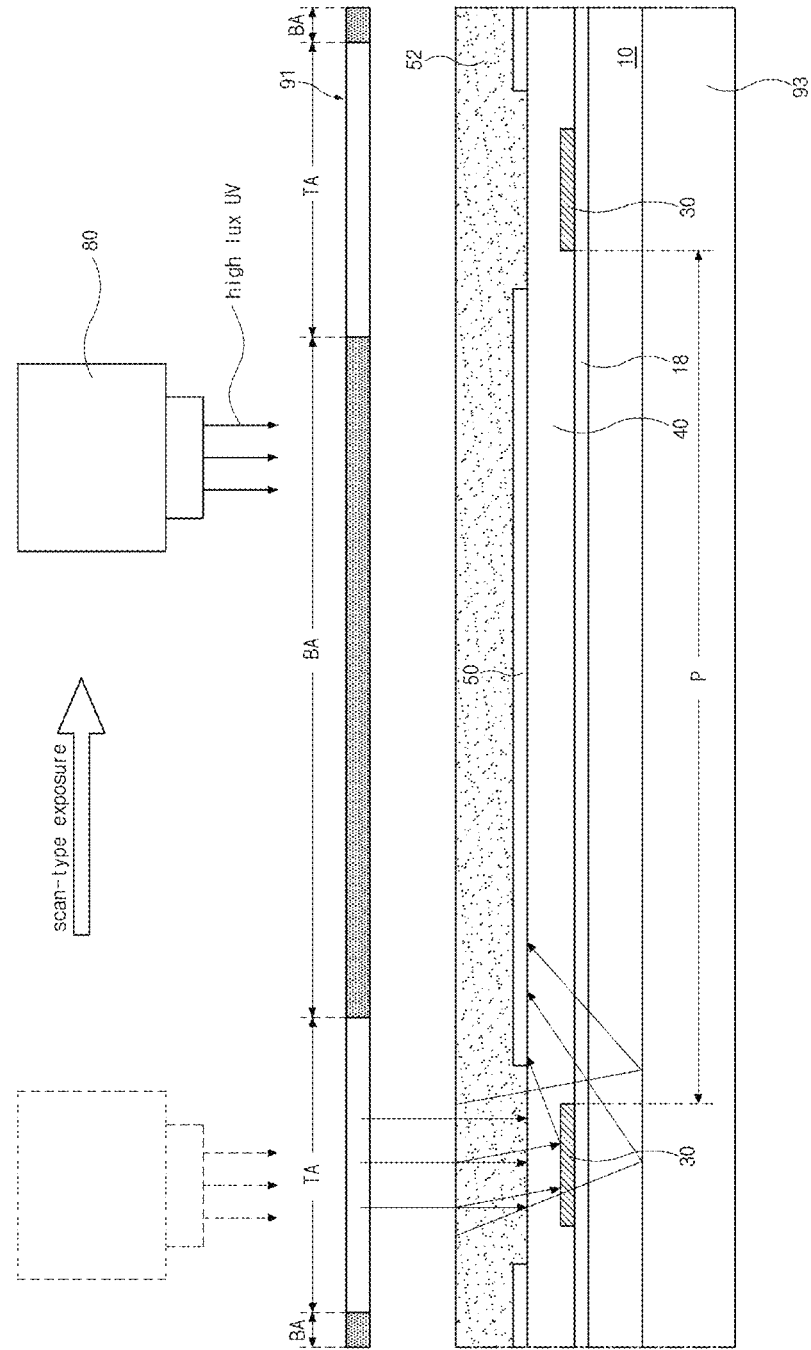
FIGS. 1A to 1C are schematic cross-sectional views showing an OLED display device according to the related art in steps of fabricating the OLED display device.
Figure 1B:
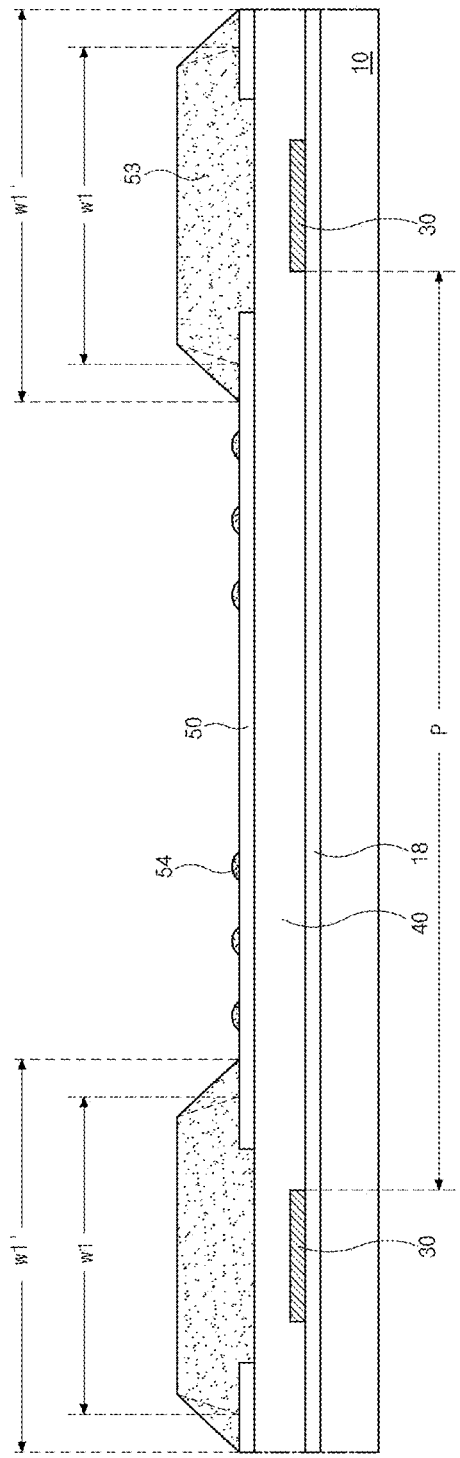
Figure 1C:
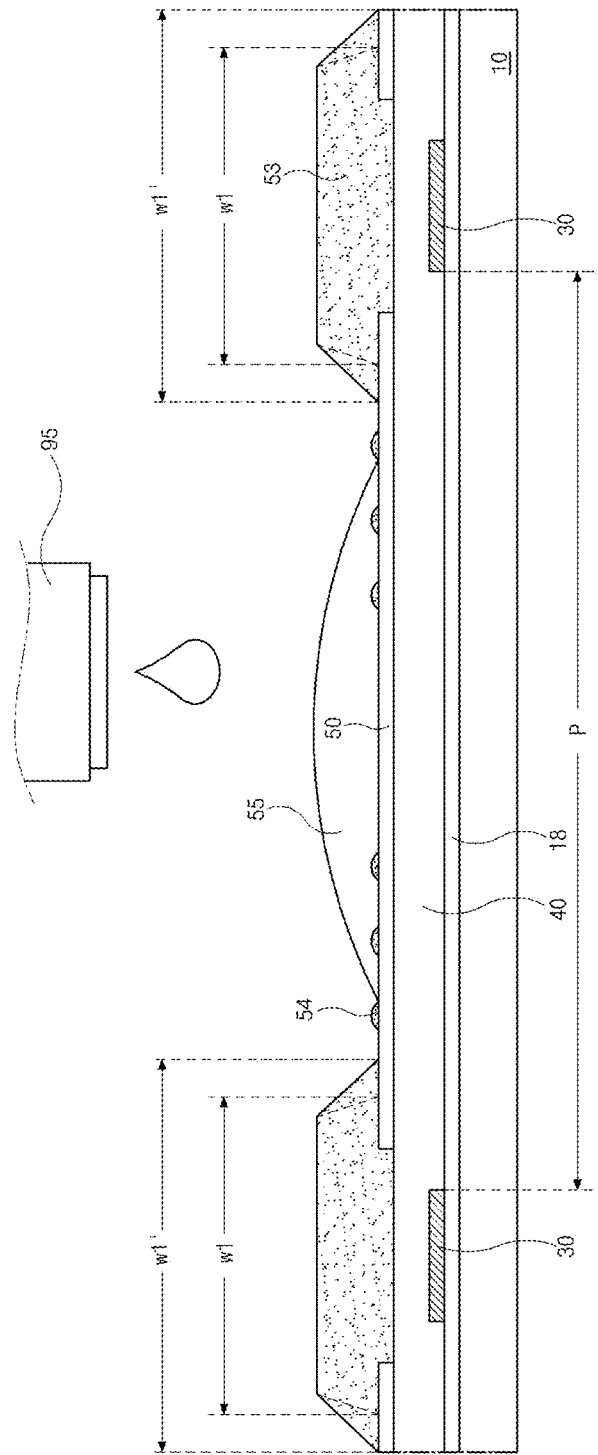
Figure 2:
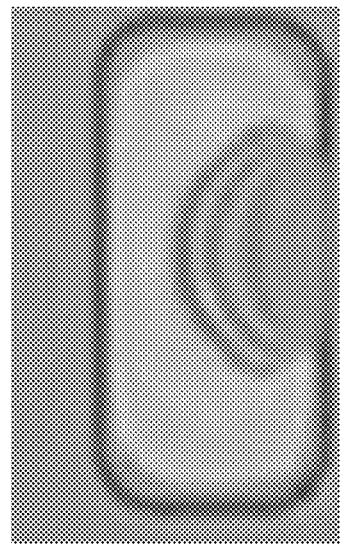
FIG. 2 is a picture showing one pixel region in the related art OLED display device.

Furthermore, since the second bank 153b has the second width w' smaller than the first width of the first bank 153a and the second width w' corresponds to a designed width w, which includes an error range considering a practical exposing process, the aperture ratio of the OLED display device of the invention is improved as compared to the related art OLED display device including the bank 53 of FIG. 1C having the large tails.

A method of forming the bank 153 will be described in more detail later.

An organic light emitting layer 155 is formed in each pixel region P surrounded by the bank 153 having the double-layered structure. The organic light emitting layer 155 includes red, green and blue light emitting materials in respective pixel regions P.

The organic light emitting layer 155 is formed by forming an organic light emitting material layer and curing the organic light emitting material layer. The organic light emitting material layer is formed by coating, i.e., spraying or dropping a liquid phase organic light emitting material by an liquid-releasing apparatus or a nozzle-coating apparatus.

Figure 7:
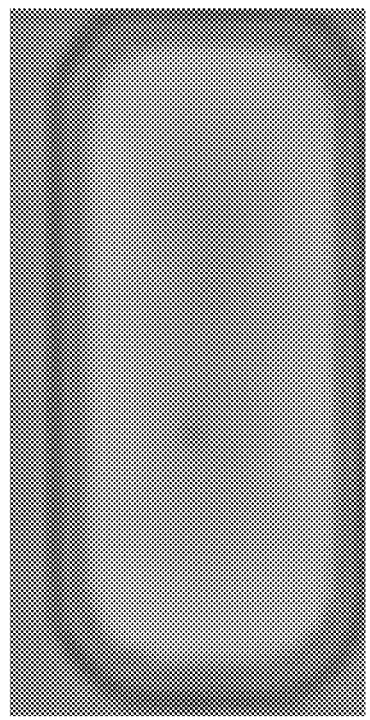
FIG. 7 is a picture showing one pixel region in an OLED display device according to the present invention when the OLED display device is driven.

Referring to FIG. 4 and FIG. 7, which is a picture showing one pixel region in an OLED display device according to the present invention when the OLED display device is driven, in the OLED display device 101 including the bank 153 having a double-layered structure, the organic light emitting layer 155 is formed to have a uniform thickness in an entire surface of an area surrounded by the bank 153 at each pixel region P. Substantially, the organic light emitting layer 155 has a uniform thickness in an area surrounded by the first bank 153a.

This is why the liquid phase organic light emitting material is spread well because there is no hydrophobic residue on the first electrode 150.

FIG. 4 shows a single-layered organic light emitting layer 155. Alternatively, to improve light emission efficiency, the organic light emitting layer 155 may have a multi-layered structure. For example, the organic light emitting layer 155 may include a hole injecting layer, a hole transporting layer, a light emitting material layer, an electron transporting layer and an electron injecting layer stacked on the first electrode 150 as an anode. The organic light emitting layer 155 may be a quadruple-layered structure of a hole transporting layer, a light-emitting material layer, an electron transporting layer and an electron injecting layer or a triple-layered structure of a hole transporting layer, a light emitting material layer and an electron transporting layer.

A second electrode 160 is formed on the organic light emitting layer 155 and covers an entire surface of a display region of the first substrate 110. The second electrode 160 is formed of a metallic material having a relatively low work function, e.g., aluminum (Al), Al alloy such as aluminum neodymium (AlNd), silver (Ag), magnesium (Mg), gold (Au), or aluminum magnesium alloy (AlMg). The second electrode 160 serves as a cathode.

The first electrode 150, the organic light emitting layer 155 and the second electrode 160 constitute the light emitting diode E.

A seal pattern (not shown) of a sealant or a fit material is formed on edges of the first substrate 110 or the second substrate 170. The first and second substrates 110 and 170 are attached using the seal pattern. A space between the first and second substrates 110 and 170 has a vacuum condition or an inert gas condition. The second substrate 170 may be a flexible plastic substrate or a glass substrate.

Alternatively, the second substrate 170 may be a film contacting the second electrode 160. In this instance, the film-type second substrate is attached to the second electrode 160 by an adhesive layer.

In addition, an organic insulating film or an inorganic insulating film may be formed on the second electrode 160 as a capping layer. In this instance, the organic insulating film or the inorganic insulating film serves as the encapsulation film without the second substrate 170.

Hereinafter, a method of fabricating the OLED display device is explained with reference to drawings. FIGS. 8A to 8H are cross-sectional views showing a fabricating process of an OLED display device according to an embodiment of the present invention. The explanation is focused on a bank having a double-layered structure.

As shown in FIG. 8A, the gate line (not shown), the data line 130 and the power line (not shown) are formed on the first substrate 110. In addition, the switching TFT (not shown) connected to the gate line and the data line 130 and the driving TFT DTr connected to the switching TFT and the power line are formed in the switching area (not shown) and in the driving area, respectively.

As explained above, each of the switching TFT and the driving TFT DTr has a bottom gate type TFT including the gate electrode 115 of FIG. 4 or 213 of FIG. 5 as a lowest layer or a top gate type TFT including the semiconductor layer 313 of FIG. 6 as a lowest layer. The bottom gate type TFT includes the oxide semiconductor layer 120 of FIG. 4 or the amorphous silicon semiconductor layer 220 of FIG. 5 including the active layer 220a and the ohmic contact layer 220b, and the top gate type TFT includes the poly-silicon semiconductor layer 313 of FIG. 6.

Here, the switching TFT and the driving TFT DTr may be the bottom gate type TFT including an oxide semiconductor layer. Therefore, the gate electrode 115 of the driving TFT DTr is formed on the first substrate 110, the gate insulating layer 118 is formed on the gate electrode 115, and the oxide semiconductor layer 120 is formed on the gate insulating layer 118 corresponding to the gate electrode 115. The etch-stopper 122 is formed on the oxide semiconductor layer 120 and covers the center of the oxide semiconductor layer 120. The source and drain electrodes 133 and 136 are formed on the etch-stopper 122 and spaced apart from each other.

Next, an organic insulating material, e.g., photo-acryl, is coated over the switching TFT and the driving TFT DTr and is patterned to form the passivation layer 140 having a flat top surface and including the drain contact hole 143. The drain electrode 136 of the driving TFT DTr is exposed through the drain contact hole 143.

Next, a transparent conductive material, which has a relatively high work function, is deposited on the passivation layer 140 and patterned to form the first electrode 150. The first electrode 150 contacts the drain electrode 136 of the driving TFT DTr through the drain contact hole 143 and is separated in each pixel region P. For example, the transparent conductive material may be indium tin oxide (ITO).

Figure 8B:
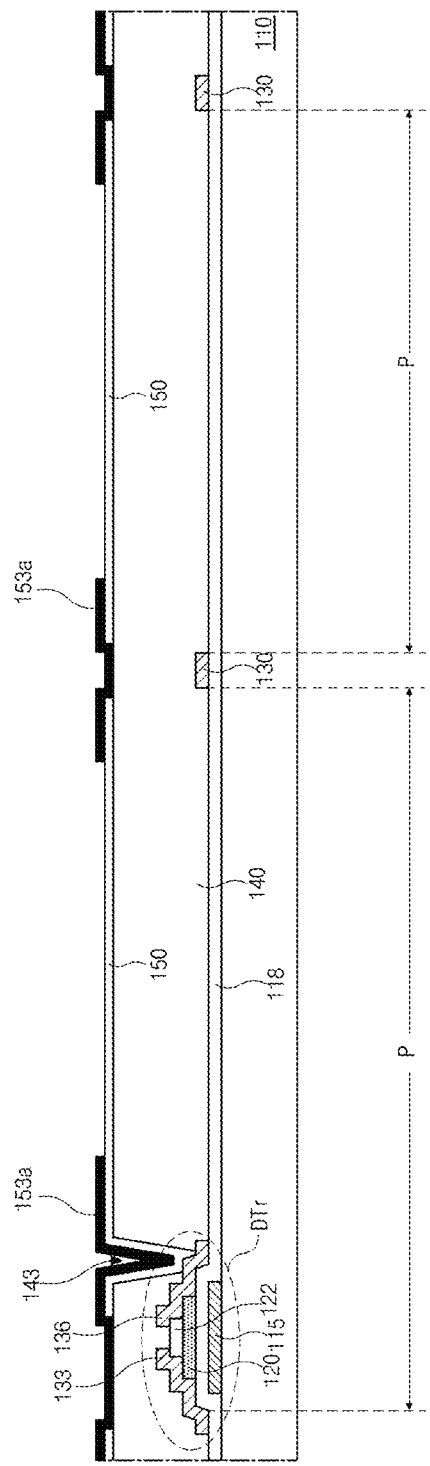

Next, as shown in FIG. 8B, an inorganic insulating material having relatively high light absorptivity and blocking penetration of light, e.g., chromium oxide (CrOx) is deposited on the first electrode 150 and the passivation layer 140 and is patterned to thereby form the first bank 153a. The first bank 153a corresponds to the boundaries of the pixel region P and overlaps the edges of the first electrode 150. The first bank 153a has the first width.

Figure 8C:
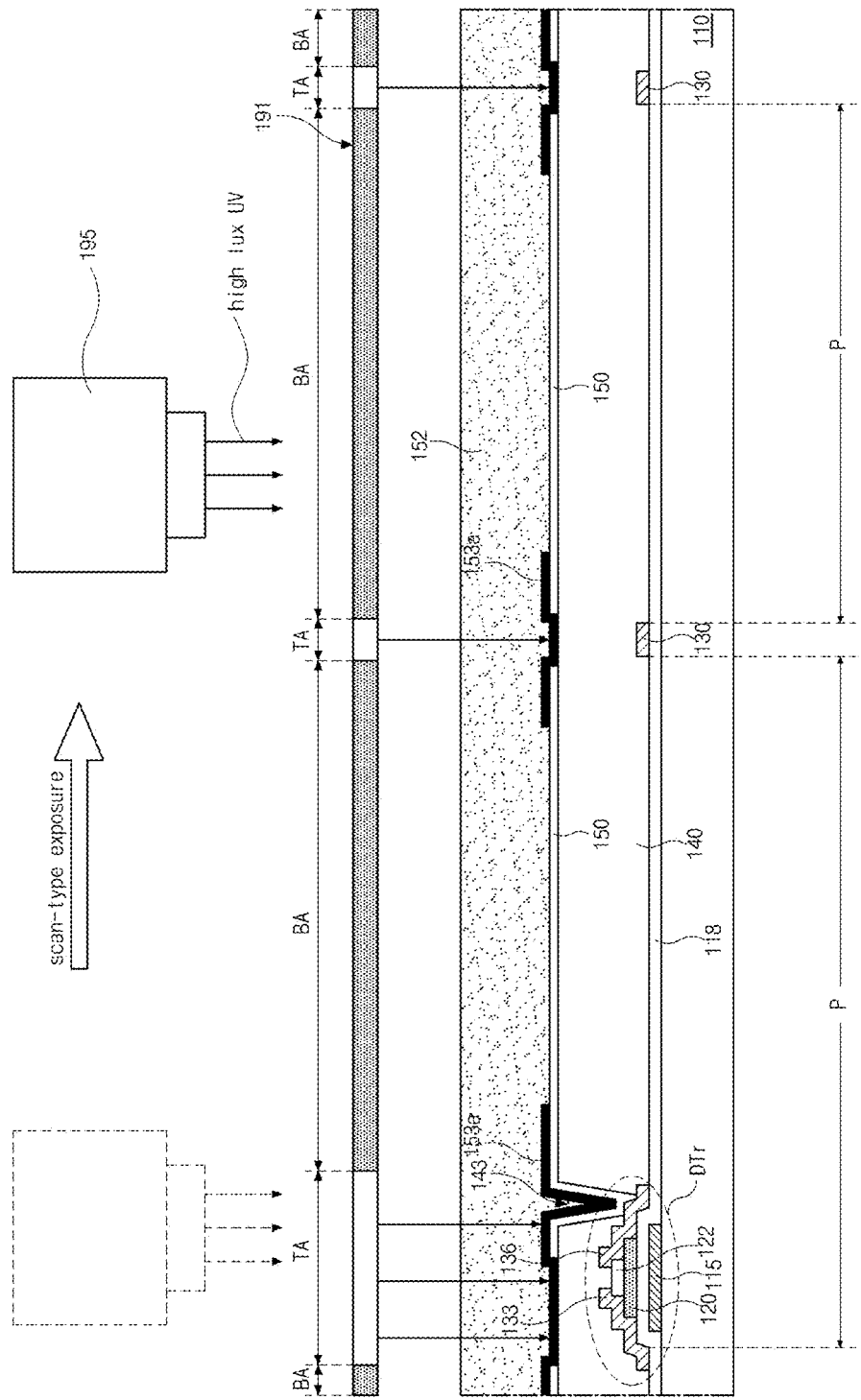

As shown in FIG. 8C, an organic insulating material layer 152 is formed on the first bank 153 and the first electrode 150. For example, the organic insulating material layer 152 may be formed by applying an organic insulating material to a substantially entire surface of the first substrate 110. The organic insulating material, beneficially, may have a photosensitive property and a hydrophobic property. The organic insulating material may include at least one of polyimide containing fluorine (F), styrene, methylmethacrylate, and polytetrafluoroethylene.

An exposing mask 191 including a light-transmitting region TA and a light-blocking region BA is disposed over the organic insulating material layer 152, and a scan-type exposure apparatus 195 including high lux UV light of 100 to 990 mW/cm$^2$ is disposed over the exposing mask 191. The organic insulating material layer 152 is scanned by the scan-type exposure apparatus 195 by selectively irradiating the high lux UV light to the organic insulating material layer 152, thereby performing a light-exposing process.

A portion of the organic insulating material layer 152 corresponding to the light-transmitting region TA of the exposing mask 191 is exposed to the UV light, and a portion of the organic insulating material layer 152 corresponding to the light-blocking region BA is not exposed to the UV light. Here, the organic insulating material layer 152 is shown to have a negative type photosensitive property with which an exposed portion of the organic insulating material layer 152 remains after a developing process. Alternatively, the organic insulating material layer 152 may have a positive type photosensitive property, and at this time, the positions of the light-transmitting region TA and the light-blocking region BA are exchanged.

At this time, the high lux UV light reaching the organic insulating material layer 152 through the light-transmitting region TA of the exposing mask 191 passes through the organic insulating material layer 152 and heads toward elements under the organic insulating material layer 152. However, the UV light is blocked by the first bank 153a, which is formed of an insulating material having relatively high light absorptivity and blocking penetration of light, and the UV light passing through the organic insulating material layer 152 is prevented from being incident on elements under the first bank 153a.

Figure 8D:
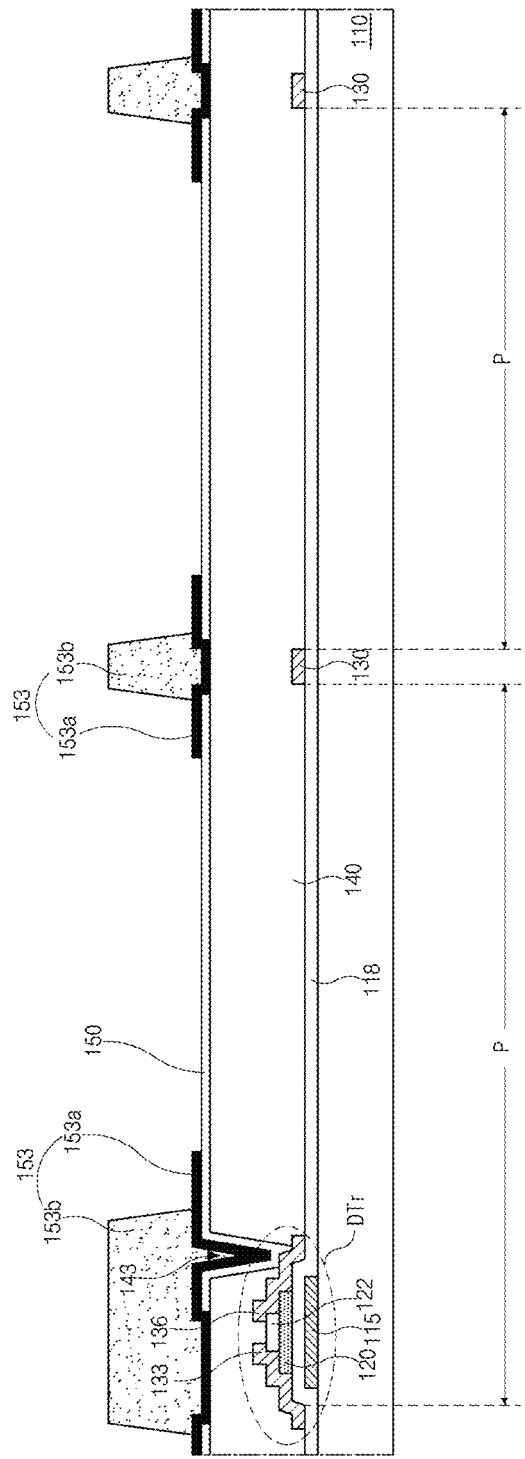

More particularly, the first bank 153a may have the same shape as the light-transmitting region TA of the exposing mask 191 for forming the second bank 153b of FIG. 8D, and the first bank 153a may have the first width larger than the second width of the second bank 153b of FIG. 8D. The light-transmitting region TA may have substantially the same width as the second width of the second bank 153b of FIG. 8D.

Therefore, the high lux UV light may be irradiated only to a portion of the organic insulating material layer 152 corresponding to the second bank 153b of FIG. 8D. Moreover, since the first bank 153a has the first width wider than the width of the light-transmitting region TA of the exposing mask 191, the high lux UV light irradiated through the light-transmitting region TA is incident on the first bank 153a and is not incident on other areas after passing through the organic insulating material layer 152.

At this time, no UV light passes through the first bank 153a because the first bank 153 absorbs light and blocks penetration of light.

Accordingly, even though the high lux UV light is irradiated to the organic insulating material layer 152 for forming the second bank 153b of FIG. 8D, the UV light does not reach the gate line, the data line 130 and the power line of a metallic material reflecting light under the organic insulating material layer 152 or the stage of the scan-type exposure apparatus 195 on which the first substrate 110 is disposed, and there is no light reflected by the above-mentioned elements. Furthermore, no light is incident on a bottom surface of the organic insulating material layer 152 on the first electrode 150 in the pixel region P after being reflected by the above-mentioned elements.

Next, as shown in FIG. 8D, the second bank 153b is formed on the first bank 153a by developing and removing the organic insulating material layer 152 of FIG. 8C exposed to light. The second bank 153b has the second width smaller than the first width of the first bank 153a. The second bank 153b is disposed on edges of the first bank 153a.

Here, the organic insulating material layer 152 of FIG. 8C contacting the first electrode 150 is completely removed, and thus there is no hydrophobic residue on the first electrode 150. Therefore, the liquid phase organic light emitting material for forming the organic light emitting layer 155 of FIG. 8H is spread well when it is sprayed or dropped.

Moreover, the second bank 153b does not have tails due to UV light reflected perimetrically and has the second width, which is substantially equal to the designed width.

In the meantime, the first bank 153a has a thickness thinner than the second bank 153b.

Figure 8E:
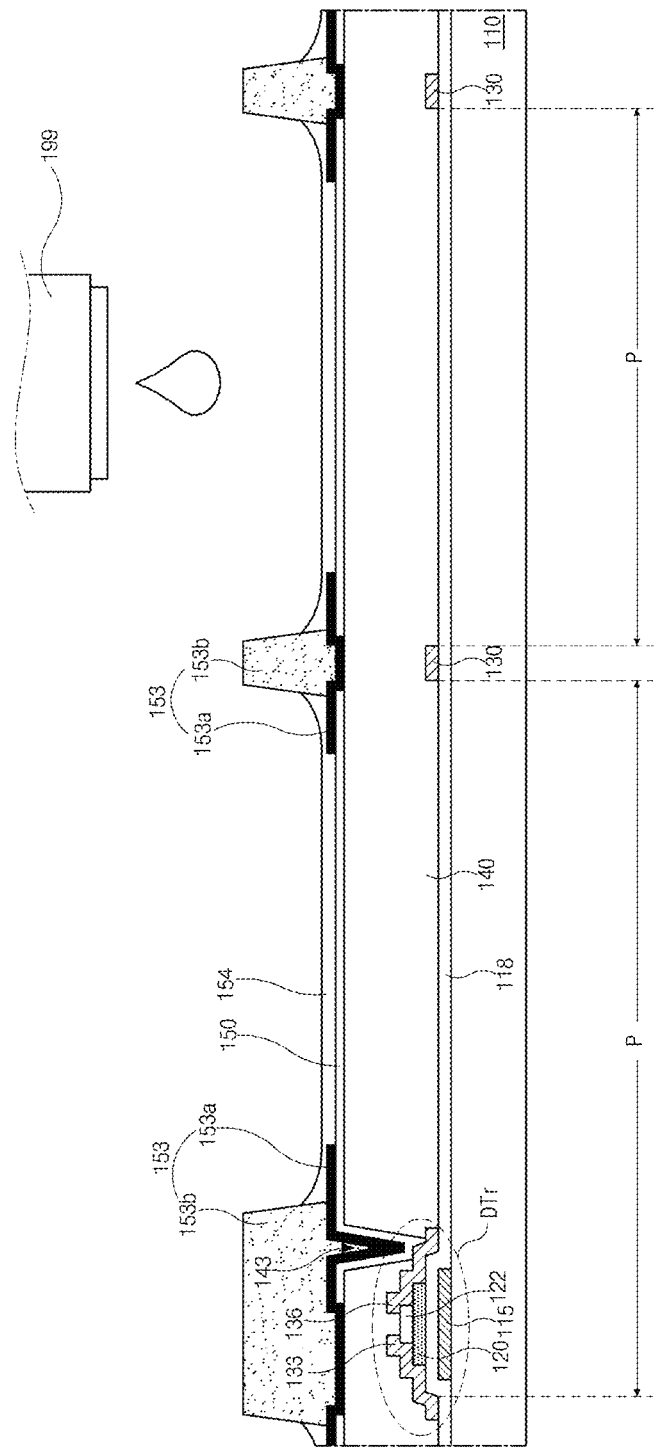

Next, as shown in FIG. 8E, after forming the bank 153 having the double-layered structure, an organic light emitting material layer 154 is formed on the first electrode 150 and the first bank 153a exposed outwards side surfaces of the second bank 153b by spraying or dropping a liquid phase organic light emitting material in a region surrounded by the bank 153, more particularly, surrounded by the second bank 153b, in the pixel region P with an liquid-releasing apparatus 199 or a nozzle-coating apparatus (not shown).

Even if the organic light emitting material is sprayed or dropped on the second bank 153b because of a mis-alignment of the liquid-releasing apparatus 199 or the nozzle-coating apparatus, the organic light emitting material is concentrated into a center of the pixel region P because the second bank 153b has the hydrophobic property. In addition, even if an excessive amount of the organic light emitting material is sprayed or dropped, the organic light emitting material does not flow over the second bank 153b due to the hydrophobic property of the second bank 153b.

Moreover, since the hydrophobic residue does not exist on the first electrode 150, the liquid phase organic light emitting material is spread well on the first electrode 150. Furthermore, the organic light emitting material layer 154 is formed on the first bank 153a because the second bank 153b has the second width smaller than the first bank 153a, and the organic light emitting material is concentrated into the center of the pixel region P when it is sprayed or dropped. Thus, the thickness of the organic light emitting material layer 154 is prevented from being thickened around the second bank 153b.

Accordingly, the organic light emitting material layer 154 has a flat top surface and a uniform thickness without deviation in thickness in the pixel region P surrounded by the first bank 153a. The pixel region P surrounded by the first bank 153a corresponds to an effective light emission area where an image is displayed to a viewer, and the effective light emission area is larger than that of the related art OLED display device including the bank 53 of FIG. 1C. Therefore, the aperture ratio is increased.

Figure 8F:
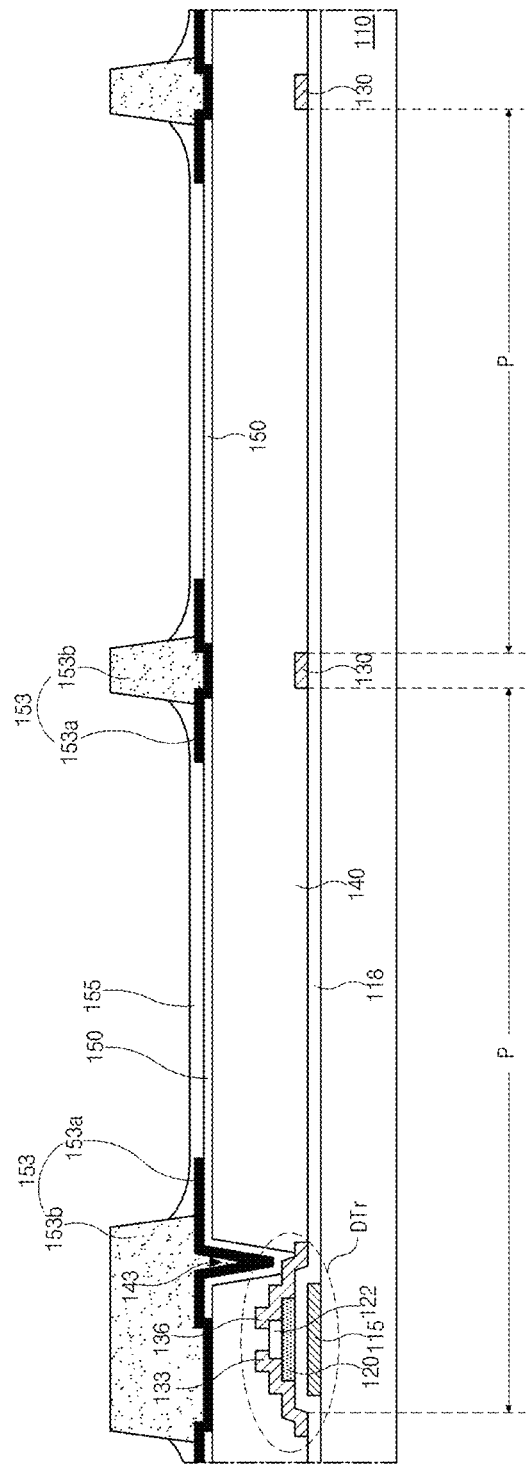

Next, as shown in FIG. 8F, by performing a curing process, solvents and moisture in the organic light emitting material layer 154 of FIG. 8E are removed such that the organic light emitting layer 155 is formed in the pixel region P.

Here, the organic light emitting layer 155 has a single-layered structure. Alternatively, to improve light emission efficiency, the organic light emitting layer 155 may have a multi-layered structure, which may be formed by the same method as that of the single-layered structure or may be formed in an entire surface of a display region by a deposition method. For example, the organic light emitting layer 155 may include a hole injecting layer, a hole transporting layer, a light emitting material layer, an electron transporting layer and an electron injecting layer stacked on the first electrode 150 as an anode. The organic light emitting layer 155 may be a quadruple-layered structure of the hole transporting layer, the light emitting material layer, the electron transporting layer and an electron injecting layer or a triple-layered structure of the hole transporting layer, the light emitting material layer and the electron transporting layer.

Figure 8G:
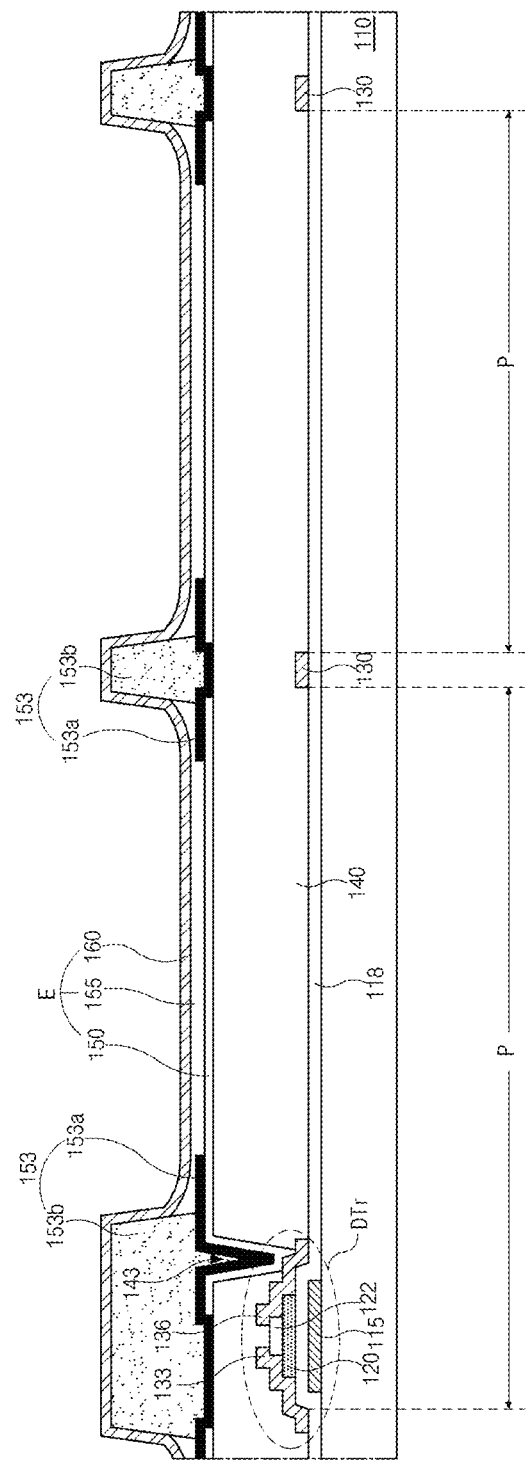
Figure 8H:
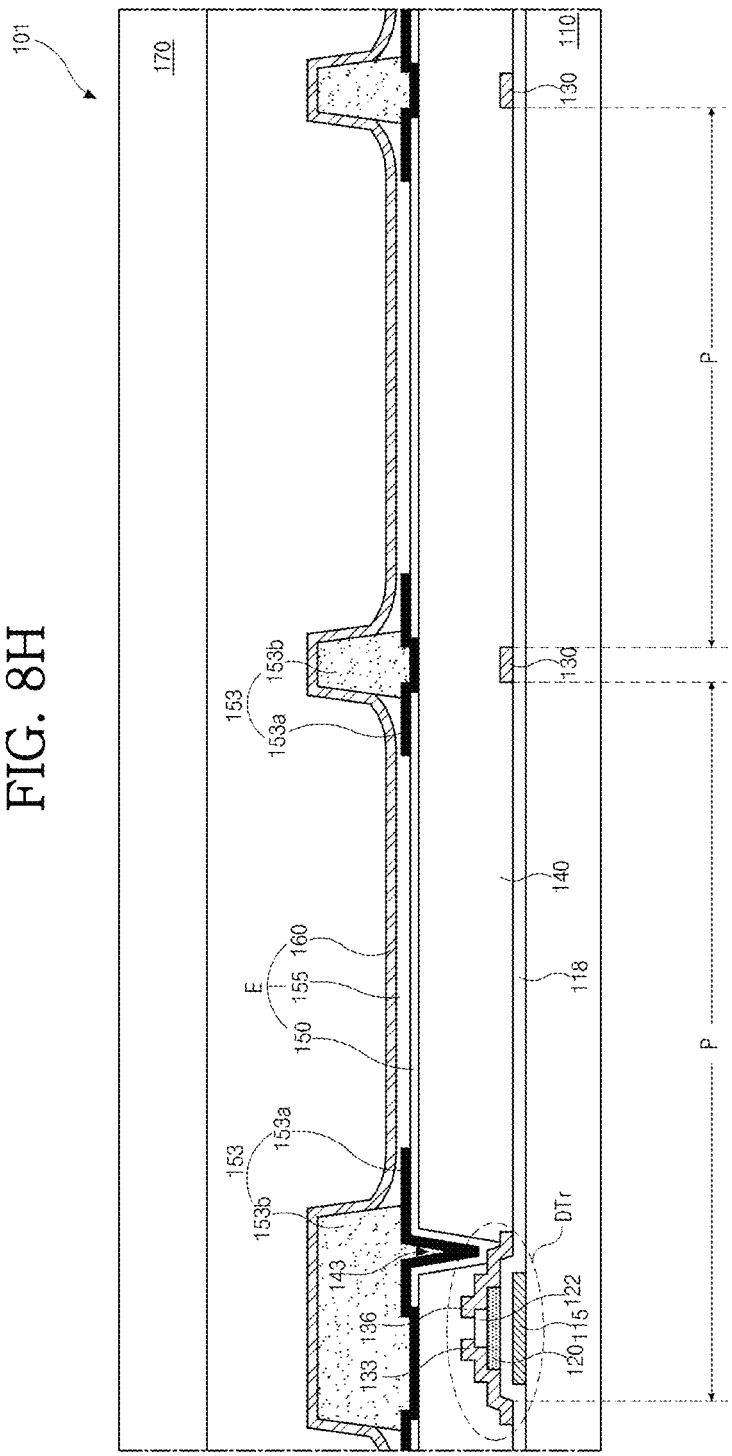

Next, as shown in FIG. 8G, the second electrode 160 is formed on the organic light emitting layer 155 by depositing a metallic material having a relatively low work function. The second electrode 160 is formed on an entire surface of the display region. The metallic material includes at least one of Al, Al alloy such as AlNd, Ag, Mg, Au and AlMg.

As explained above, the first electrode 150, the organic light emitting layer 155 and the second electrode 160 constitute the light emitting diode E.

Next, as shown in FIG. 8H, after forming a seal pattern (not shown) on edges of the first substrate 110 or the second substrate 170, the first and second substrates 110 and 170 are attached under a vacuum condition or an inert gas condition such that the OLED display device is fabricated. Alternatively, a paste seal (not shown), which is formed of a frit material, an organic insulating material or a polymer material having transparent and adhesive properties is formed over an entire surface of the first substrate 110, and then the first and second substrates 110 and 170 are attached. As explained above, instead of the second substrate 170, an inorganic insulating film or an organic insulating film may be used for an encapsulation and may be attached by an adhesive layer.

In the OLED display device of the invention, since the bank has the double-layered structure of the first bank blocking penetration of light and having the first width and the second bank having the hydrophobic property and the second width smaller than the first width, the hydrophobic residues hardly remain on the first electrode even if the bank is formed using the scan-type exposure apparatus with high lux UV light.

Therefore, the liquid phase organic light emitting material is spread well in the pixel region surrounded by the bank when it is sprayed or dropped.

Moreover, the organic light emitting layer has a uniform thickness in the pixel region, and the organic light emitting layer is prevented from being degraded, thereby lengthening lifetime of the device.

Furthermore, the effective light emission area, where the organic light emitting layer has the flat top surface, i.e., a uniform thickness, is increased due to the second width of the second bank smaller than the first width. As a result, the aperture ratio of the OLED display device is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
    a first substrate including a display region, wherein a plurality of pixel regions are defined in the display region;
    a first electrode over the first substrate and in each of the plurality of pixel regions;
    a first bank on edges of the first electrode and including an insulating material having a property for blocking penetration of light;
    a second bank on the first bank and including an insulating material having a hydrophobic property;
    an organic light emitting layer on the first electrode and a portion of the first bank surrounded by the second bank in each of the plurality of pixel regions, wherein the organic light emitting layer directly contacts side surfaces of the second bank; and
    a second electrode on the organic light emitting layer and covering an entire surface of the display region.

2. The organic light emitting diode display device according to claim 1, wherein the insulating material included in the first bank is a light-absorption material.

3. The organic light emitting diode display device according to claim 1, wherein the first bank has a first width and the second bank has a second width smaller than the first width.

4. The organic light emitting diode display device according to claim 1, wherein the first bank includes chromium oxide CrOx, and the second bank includes at least one of polyimide containing fluorine, styrene, methylmethacrylate, and polytetrafluoroethylene.

5. The organic light emitting diode display device according to claim 1, further comprising:
    a switching thin film transistor and a driving thin film transistor in each of the plurality of pixel regions and under the first electrode; and
    a passivation layer covering the switching thin film transistor and the driving thin film transistor and exposing a drain electrode of the driving thin film transistor,
    wherein the first electrode is disposed on the passivation layer and contacts the drain electrode of the driving thin film transistor.

6. The organic light emitting diode display device according to claim 5, further comprising:
    a gate line and a data line connected to the switching thin film transistor and crossing each other to define each of the plurality of pixel regions; and
    a power line connected to the driving thin film transistor and parallel to the gate line or the data line.

7. The organic light emitting diode display device according to claim 6, further comprising a second substrate facing the first substrate or an encapsulation film contacting the second electrode.

8. A method of fabricating an organic light emitting diode display device, comprising:
    forming a first electrode over a first substrate including a display region, which includes a plurality of pixel regions, the first electrode formed in each of the plurality of pixel regions;
    forming a first bank on edges of the first electrode and including an insulating material blocking penetration of light;
    forming a second bank on the first bank, the second bank including an insulating material having a hydrophobic property;
    forming an organic light emitting layer on the first electrode and a portion of the first bank surrounded by the second bank in each of the plurality of pixel regions, wherein the organic light emitting layer directly contacts side surfaces of the second bank; and
    forming a second electrode on the organic light emitting layer, the second electrode covering an entire surface of the display region.

9. The method according to claim 8, wherein the insulating material included in the first bank is a light-absorption material.

10. The method according to claim 8, wherein the first bank includes chromium oxide CrOx, and the second bank includes at least one of polyimide containing fluorine, styrene, methylmethacrylate, and polytetrafluoroethylene.

11. The method according to claim 8, wherein the first bank has a first width and the second bank has a second width smaller than the first width.

12. The method according to claim 11, wherein forming the second bank includes:
    forming an organic insulating material layer on the first bank by applying the insulating material having the hydrophobic property to an entire surface of the first substrate;

disposing an exposing mask including a light-transmitting region and a light-blocking region over the organic insulating material layer and irradiating UV light of 100 to 990 mW/cm² to the organic insulating material layer through the exposing mask; and developing the organic insulating material layer, which has been exposed to the UV light, wherein the light-transmitting region is disposed over an overlapping area of the first bank and the second bank such that the UV light is irradiated only to the overlapping area corresponding to the second width.

13. The method according to claim 12, wherein forming the organic light emitting layer includes:

forming an organic light emitting material layer on the first electrode and the portion of the first bank in each of the plurality of pixel regions surrounded by the second bank by spraying or dropping a liquid phase organic light emitting material using an liquid-releasing apparatus or a nozzle-coating apparatus; and curing the organic light emitting material layer to form the organic light emitting layer.

14. The method according to claim 8, further comprising:

forming gate and data lines and a power line and forming a switching thin film transistor and a driving thin film transistor in each of the plurality of pixel regions before forming the first electrode, the gate and data lines crossing each other to define each of the plurality of pixel regions, the power line parallel to the gate line or the data line, the switching thin film transistor connected to the gate and data lines, and the driving thin film transistor connected to the power line and the switching thin film transistor; and forming a passivation layer covering the switching thin film transistor and the driving thin film transistor and exposing a drain electrode of the driving thin film transistor, wherein the first electrode is disposed on the passivation layer and contacts the drain electrode of the driving thin film transistor.

* * * * *